United States Patent
Tonosaki et al.

(10) Patent No.: US 8,694,838 B2
(45) Date of Patent: *Apr. 8, 2014

(54) CACHE MEMORY, PROCESSOR, AND PRODUCTION METHODS FOR CACHE MEMORY AND PROCESSOR

(75) Inventors: Mie Tonosaki, Kawasaki (JP); Hitoshi Sakurai, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 897 days.

This patent is subject to a terminal disclaimer.

(21) Appl. No.: 12/856,661

(22) Filed: Aug. 15, 2010

(65) Prior Publication Data

US 2010/0313081 A1 Dec. 9, 2010

Related U.S. Application Data

(62) Division of application No. 11/037,002, filed on Jan. 19, 2005, now Pat. No. 7,783,939.

(30) Foreign Application Priority Data

Jul. 30, 2004 (JP) .................................. 2004-224626

(51) Int. Cl.
*G11C 29/00* (2006.01)

(52) U.S. Cl.
USPC .......................................... 714/710; 714/764

(58) Field of Classification Search
USPC .................................................. 714/710, 764
See application file for complete search history.

(56) References Cited

U.S. PATENT DOCUMENTS

| | | | |
|---|---|---|---|
| 5,295,101 A | 3/1994 | Stephens et al. | |
| 5,708,789 A | 1/1998 | McClure | |
| 5,761,138 A * | 6/1998 | Lee et al. ...................... | 365/200 |
| 6,181,614 B1 | 1/2001 | Aipperspach et al. | |
| 6,400,619 B1 | 6/2002 | Hsu et al. | |
| 6,412,044 B1 | 6/2002 | Kung | |
| 6,671,822 B1 | 12/2003 | Asher et al. | |
| 6,691,252 B2 | 2/2004 | Hughes et al. | |
| 6,864,524 B2 | 3/2005 | Masleid et al. | |
| 6,922,798 B2 | 7/2005 | Nemani et al. | |
| 6,944,807 B2 | 9/2005 | Hill et al. | |
| 7,047,466 B2 | 5/2006 | Meaney et al. | |
| 7,131,039 B2 | 10/2006 | Howlett | |
| 7,487,397 B2 | 2/2009 | Lockwood et al. | |

(Continued)

FOREIGN PATENT DOCUMENTS

| | | |
|---|---|---|
| JP | 4-243446 | 8/1992 |
| JP | 6-012893 A | 1/1994 |

(Continued)

OTHER PUBLICATIONS

"European Office Action" mailed by EPO and corresponding to European application No. 04257448.3 on May 7, 2008.

(Continued)

*Primary Examiner* — M. Mujtaba K Chaudry
(74) *Attorney, Agent, or Firm* — Fujitsu Patent Center

(57) ABSTRACT

A cache memory built in a processor comprising a plurality of independent memory blocks, pass/fail information memory unit memorizing a presence/absence of a failure occurring in each of the memory blocks, and a screening control function substituting a sound memory block for a failed memory block based on a memory content in the pass/fail information memory unit.

4 Claims, 8 Drawing Sheets

(56) References Cited

U.S. PATENT DOCUMENTS

| | | |
|---|---|---|
| 2003/0131196 A1 | 7/2003 | Park et al. |
| 2003/0191885 A1 | 10/2003 | Thimmanagari et al. |
| 2004/0025095 A1* | 2/2004 | Nemani et al. ............... 714/710 |
| 2004/0117694 A1* | 6/2004 | Howlett ...................... 714/710 |
| 2006/0004973 A1 | 1/2006 | Sardella et al. |
| 2006/0253764 A1 | 11/2006 | Kobayashi et al. |

FOREIGN PATENT DOCUMENTS

| | | |
|---|---|---|
| JP | 7-182238 | 7/1995 |
| JP | 2000-99361 | 4/2000 |
| JP | 2002-064145 A | 2/2002 |
| JP | 2003-007084 A | 1/2003 |

OTHER PUBLICATIONS

"European Office Action" mailed by EPO and corresponding to European application No. 04257448.3 on Oct. 27, 2009, in English.

"European Office Action" mailed by EPO and corresponding to European application No. 04257448.3 on Aug. 24, 2007, in English.

"Japanese Official Communication" mailed by JPO and corresponding to Japanese app0lication No. 2004-224626 on Mar. 2, 2010, with partial English translation.

USPTO, [Chaudry] "U.S. Appl. No. 11/037,002 (parent)," [CTRS] Requirement for Restriction/Election issued on Mar. 11, 2008.

USPTO, [Chaudry] "U.S. Appl. No. 11/037,002 (parent)," [CTNF] Non-Final Office Action issued on May 20, 2008.

USPTO, [Chaudry] "U.S. Appl. No. 11/037,002 (parent)," [CTNF] Non-Final Office Action issued on Aug. 21, 2009.

USPTO, [Chaudry] "U.S. Appl. No. 11/037,002 (parent)," [CTFR] Final Rejection issued on Dec. 30, 2008.

USPTO, [Chaudry] "U.S. Appl. No. 11/037,002 (parent)," [CTAV] Advisory Action issued on Jun. 4, 2009.

USPTO, [Chaudry] "U.S. Appl. No. 11/037,002 (parent)," [CTMS] Miscellaneous Action with SSP issued on Apr. 16, 2010.

USPTO, [Chaudry] "U.S. Appl. No. 11/037,002 (parent)," [NOA] Notice of Allowance and Fees Due issued on Apr. 6, 2010.

* cited by examiner

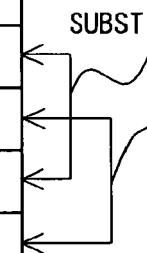
F I G. 4

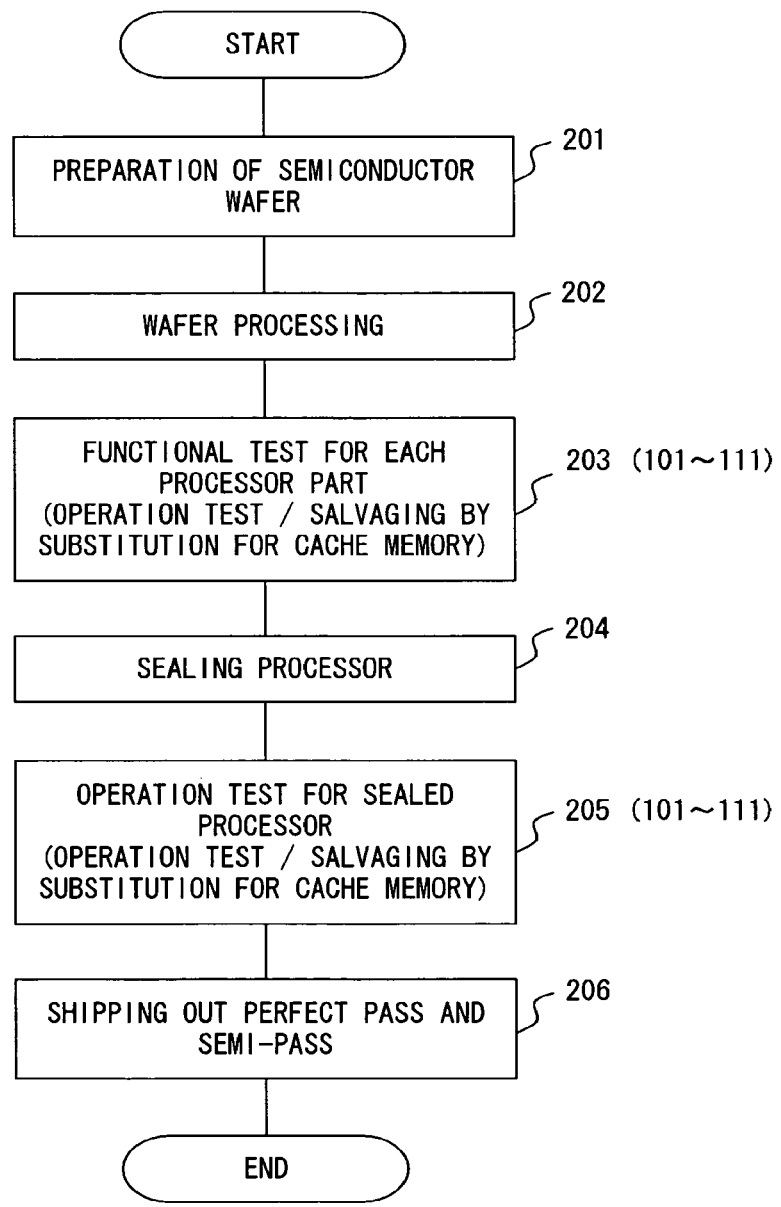
F I G. 6

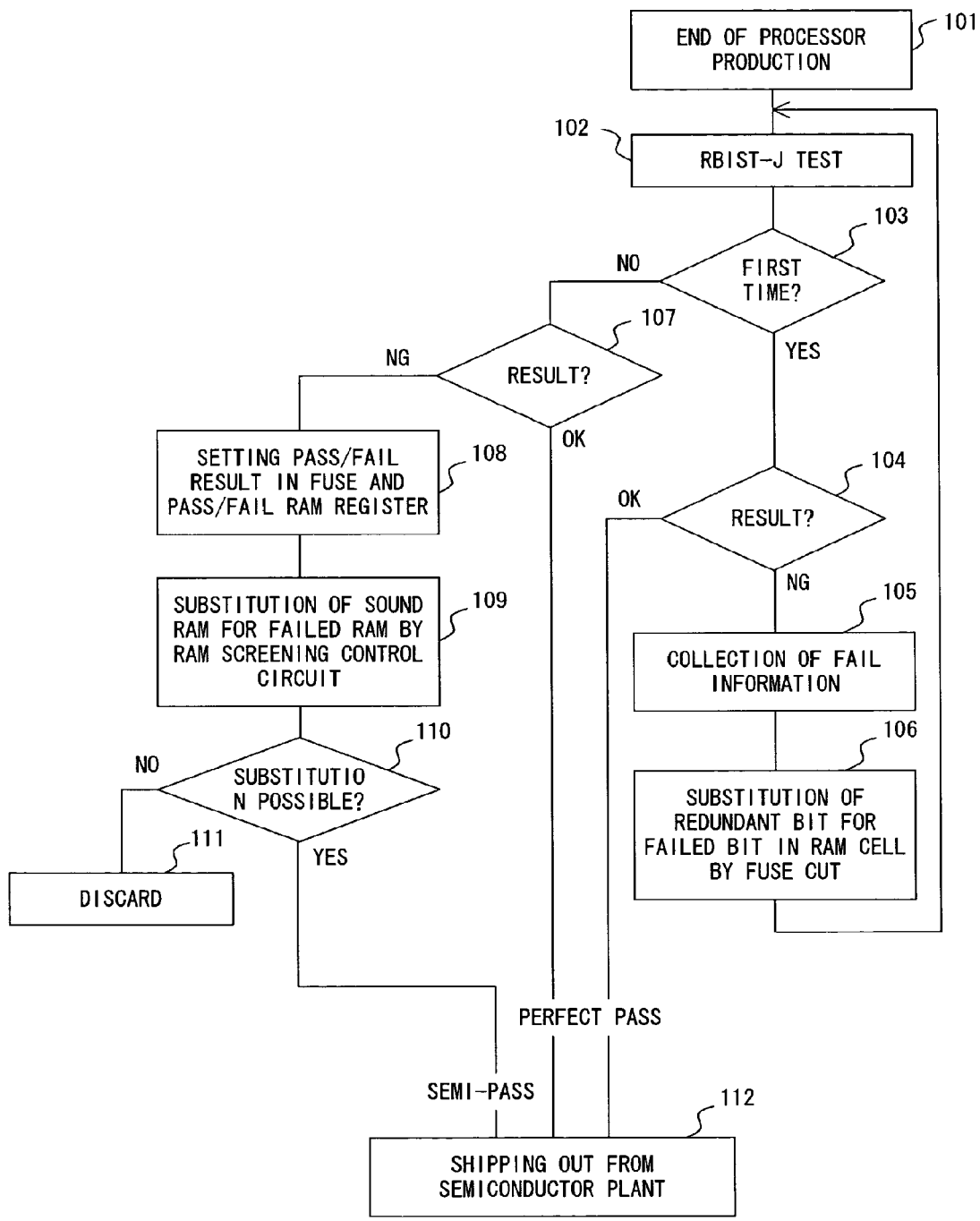
F I G. 7

CACHE MEMORY, PROCESSOR, AND PRODUCTION METHODS FOR CACHE MEMORY AND PROCESSOR

CROSS-REFERENCE TO RELATED APPLICATIONS

This application is a divisional application of U.S. application Ser. No. 11/037,002 filed with the USPTO on Jan. 19, 2005, which issued as U.S. Pat. No. 7,783,939 on Aug. 24, 2010, and claims the benefit of priority of the prior Japanese Patent Application Number 2004-224626, filed on Jul. 30, 2004. The entire contents of the prior applications are incorporated herein by reference.

BACKGROUND OF THE INVENTION

1. Field of the Invention

The present invention relates to a cache memory, a processor having a cache memory and a production technique thereof.

2. Description of the Related Art

A capacity of a cache memory built in a processor has been on the increase in recent years due to requirements for better performance, so has been a probability of a whole processor failing due to a failure in the cache memory.

In the meantime, it has been in demand to reduce varieties of product for cost reduction, it is meaningful to reduce the number of products practically by salvaging a processor failed due to a faulty cache memory with a substitution operation and thereby shipping out the processor as a lower grade processor having a smaller cache memory.

Meanwhile, produced LSI's such as processors are unit-tested before shipping. The unit test, also called a function test, is for confirming an LSI to function electrically according to the design data thereof, such as whether it operates as per the functions on a tester, logically correct, et cetera.

For example, a RAM as a component of a built-in processor cache memory usually has a self test circuit therein, by which a RBIST (Ram_Built_In_Self_Test)-J (hereinafter called "self test") is performed for testing the function of READ and WRITE for each RAM, and the result is reported as FAIL information. A redundant bit is built into a RAM for every plurality of bits which relieves a failed part thereof by substituting for the faulty bit (faulty cell array) in response to the FAIL information. The substitution is usually done using a FUSE programmable by a laser or the like. That is, a sound cell array is put into function in place of the faulty cell array by cutting the fuse (FUSE cut).

Subsequently, if the self test is conducted again, the result shall yield a pass since the faulty part has been substituted, and as such the product is successfully shipped out as a perfect "pass." However, if failed in the substitution, or if there is a manufacturing problem in RAM such as a fault in the redundant bits for substitution, a repeated FAIL will result. The RAM is accordingly diagnosed as a "fail." This is a way in which an LSI whose built-in RAM is found to be faulty by the unit test is determined as to whether or not usable as a "semi-pass" LSI having a smaller cache memory capacity.

In conventional techniques, however, since the information on RAM substitution obtained for each LSI had to be managed and set from outside the LSI, the substitution of a failed RAM with a sound RAM has been difficult in the actual operation and hence practically impossible.

For this reason, it is conceivable, for instance, to classify RAMs in two large groups and use simply a certain group of RAMs for usage modes requiring small cache memory capacities, thereby picking out the semi-passes.

In that case, however, if there is a faulty RAM in the group from which a RAM is to be selected for use, the LSI cannot secure a desired number of RAMs and hence being discarded.

As noted above, if a substitution operation is to be done on an individual RAM basis based on the substitution information on the sound and failed RAMs for each LSI obtained by a screening test, the information on the RAM substitution obtained for each LSI has conventionally to be managed and set from outside the LSI, and hence there has been no practical method available for the substitution of a sound RAM for a failed RAM.

Note that in the patent document 1 listed below, a technique is disclosed in which a faulty data address of a cache memory is set in the tag RAM of the aforementioned cache memory and, if the faulty data address is accessed, a "miss" in a hit/miss judgment is reported to the microprocessor and thereby inhibiting an access to the faulty data in the aforementioned cache memory.

Meanwhile, in the patent document 2, a technique for an LSI, such as a processor, consisting of a plurality of functional blocks is disclosed in which a partial-pass is shipped out by selectively blocking out the functional block where a failure is detected.

Meanwhile, in the patent document 3, a technique is disclosed in which the cache memory address where a parity error occurred is degraded to a lower access priority, thereby improving the overall cache memory performance.

As such, since all techniques disclosed in the patent documents 1 through 3 either isolate an error part or inhibit an access thereto, they do not contribute to a yield of cache memories by taking advantage of the aforementioned cache memories having a redundant configuration, or of processors having such a cache memory.

[Patent document 1] Japanese patent laid open application publication 7-182238
[Patent document 2] Japanese patent laid open application publication 2000-99361
[Patent document 3] Japanese patent laid open application publication 4-243446

SUMMARY OF THE INVENTION

The purpose of the present invention is to improve a yield of processors each having a cache memory.

Another purpose of the present invention is to improve a yield of processors each built-in with a cache memory having a redundant configuration.

Yet another purpose of the present invention is to provide a production technique for a processor enabling the production of a variety of processors having different cache memory capacities by taking advantage of reduced capacities in cache memories as a result of salvaging failures therein.

The first aspect of the present invention is to provide a cache memory built in a processor comprising a plurality of independent memory blocks, pass/fail information memory unit memorizing a presence/absence of a failure occurring in each of the memory blocks, and a screening control function substituting a sound memory block for a failed memory block based on a memory content of the pass/fail information memory unit.

The second aspect of the present invention is to provide a processor furnished with an execution unit, an instruction unit controlling the execution unit, a storage control unit controlling an input and output for the execution unit and instruction unit, and a cache memory temporarily storing information exchanged between the execution and instruction units, and an external memory apparatus, wherein the cache memory comprises a plurality of independent memory blocks, pass/fail information memory unit memorizing a presence/absence of a failure occurring in each of the memory blocks, and a screening control function substituting a sound memory block for a failed memory block based on a memory content of the pass/fail information memory unit.

The third aspect of the present invention is to provide a production method for a cache memory including a screening test process performing an operation test for a plurality of independent memory blocks which constitute the cache memory, and substituting a sound memory block for a failed memory block by handling a fuse provided in said cache memory based on a test result of the operation test.

The fourth aspect of the present invention is to provide a production method for a processor built in with a cache memory including a screening test process performing an operation test for a plurality of independent memory blocks which constitute the cache memory, and substituting a sound memory block for a failed memory block by handling a fuse provided in the cache memory based on a test result of the operation test.

The fifth aspect of the present invention is to provide a production method for a processor comprising the first process preparing a semiconductor wafer;

the second process forming a processor in the semiconductor wafer including a cache memory comprising a plurality of independent memory blocks, pass/fail information memory unit memorizing a presence/absence of a failure occurring in each of the memory blocks and a screening control function substituting a sound memory block for a failed memory block based on a memory content of the pass/fail information memory unit;

the third process performing the operation test for the cache memory, and substituting a sound memory block for a failed memory block by using the screening control function; and the fourth process sealing the processor individually.

According to the present invention as described above, since a sound unit can be substituted for a failed unit, with a memory block being defined as unit, in a cache memory included in a processor, the failed cache memories can be salvaged as the semi-passes by responding in finer detail to a diverse distribution aspect of failed units, thereby enabling an improvement in the production yield of the aforementioned cache memory and overall processor, as compared to, for instance, the case of dividing the whole memory into two regions and using the one in which a failure is not detected.

Also, it is possible to produce a variety of processors having different cache memory capacities by taking advantage of a reduced memory capacity associated with salvaging a failed cache memory.

BRIEF DESCRIPTION OF THE DRAWINGS

FIG. 4 shows a description of an example operation of a cache memory built into a processor according to an embodiment of the present invention;

FIG. 6 shows a flow chart of an example of a production method for a processor and a cache memory according to an embodiment of the present invention;

FIG. 7 shows a flow chart of an example of a production method for a processor and a cache memory according to an embodiment of the present invention.

DESCRIPTION OF THE PREFERRED EMBODIMENTS

Figure 1:
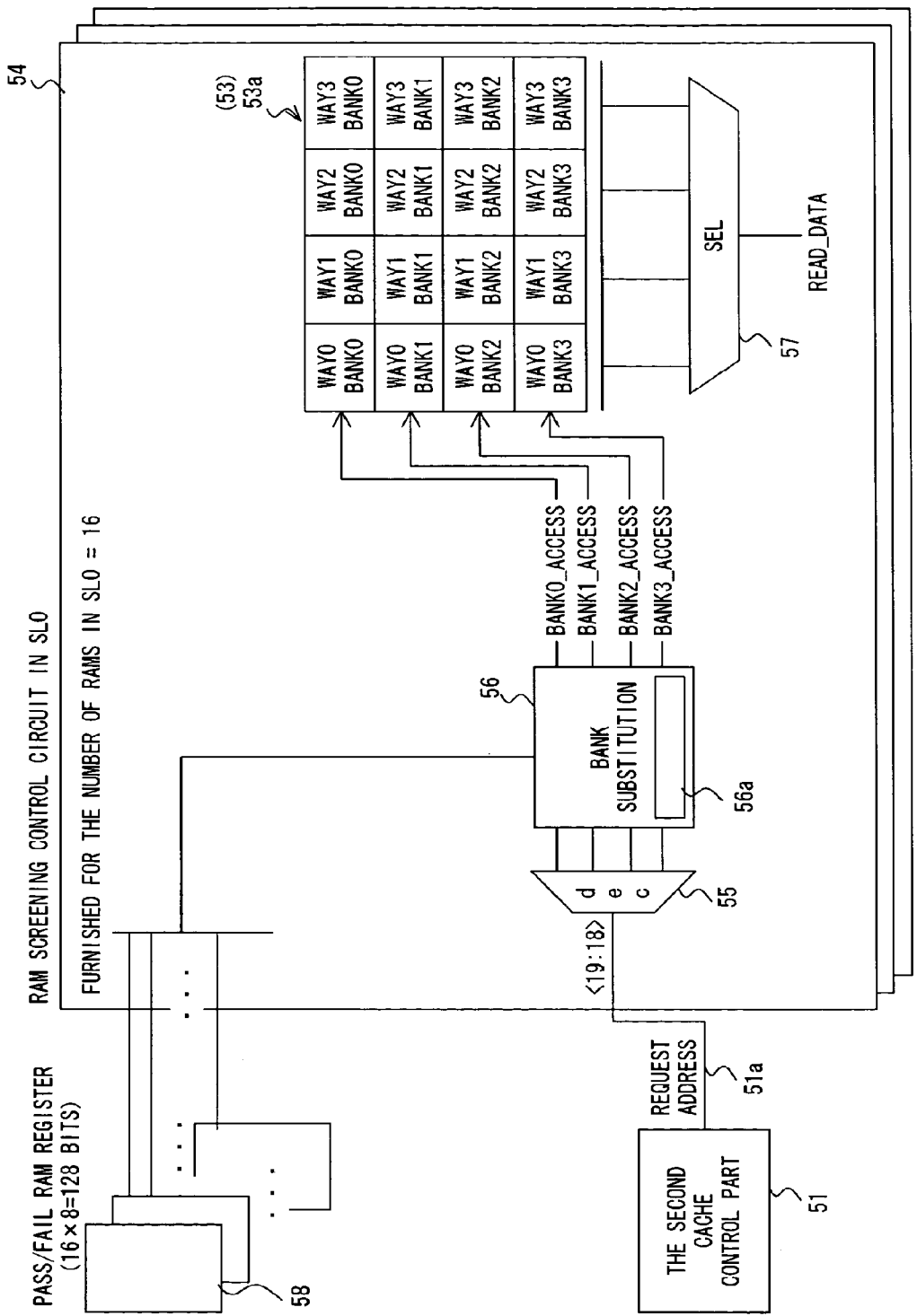
FIG. 1 illustrates an example of the architecture of a cache memory as a component of a processor according to an embodiment of the present invention.
Figure 2:
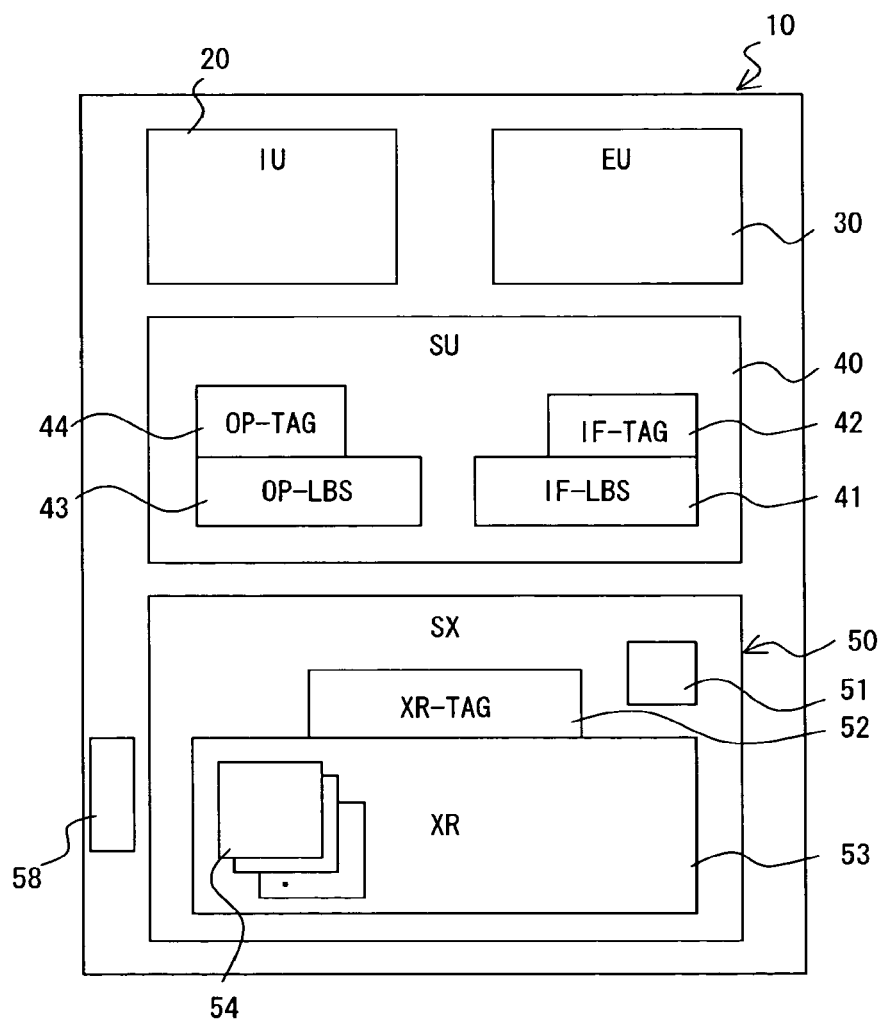
FIG. 2 illustrates an example of whole architecture of a processor according to an embodiment of the present invention.
Figure 3:
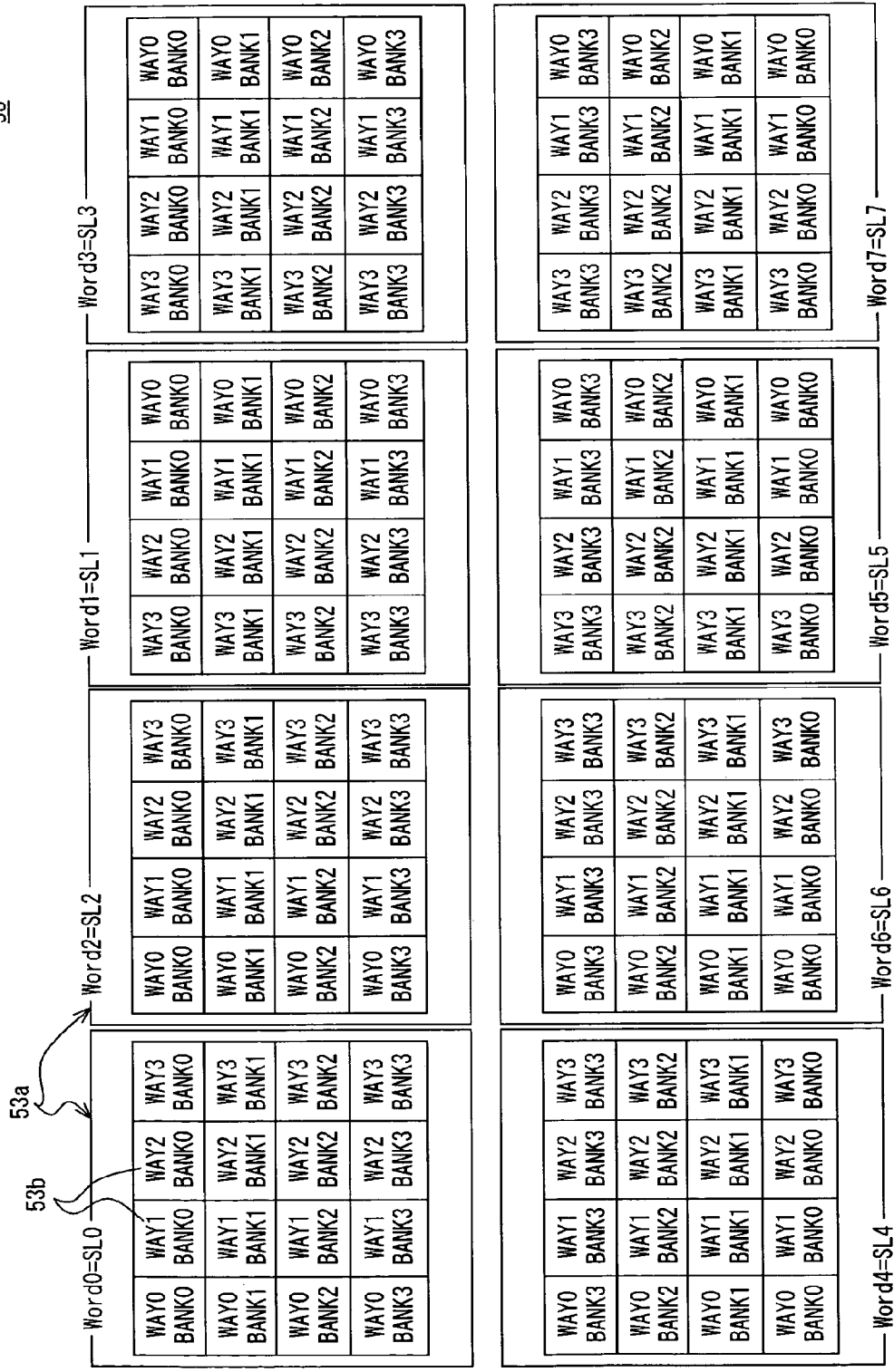
FIG. 3 illustrates an example of internal architecture of a cache memory built into a processor according to an embodiment of the present invention.
Figure 5:
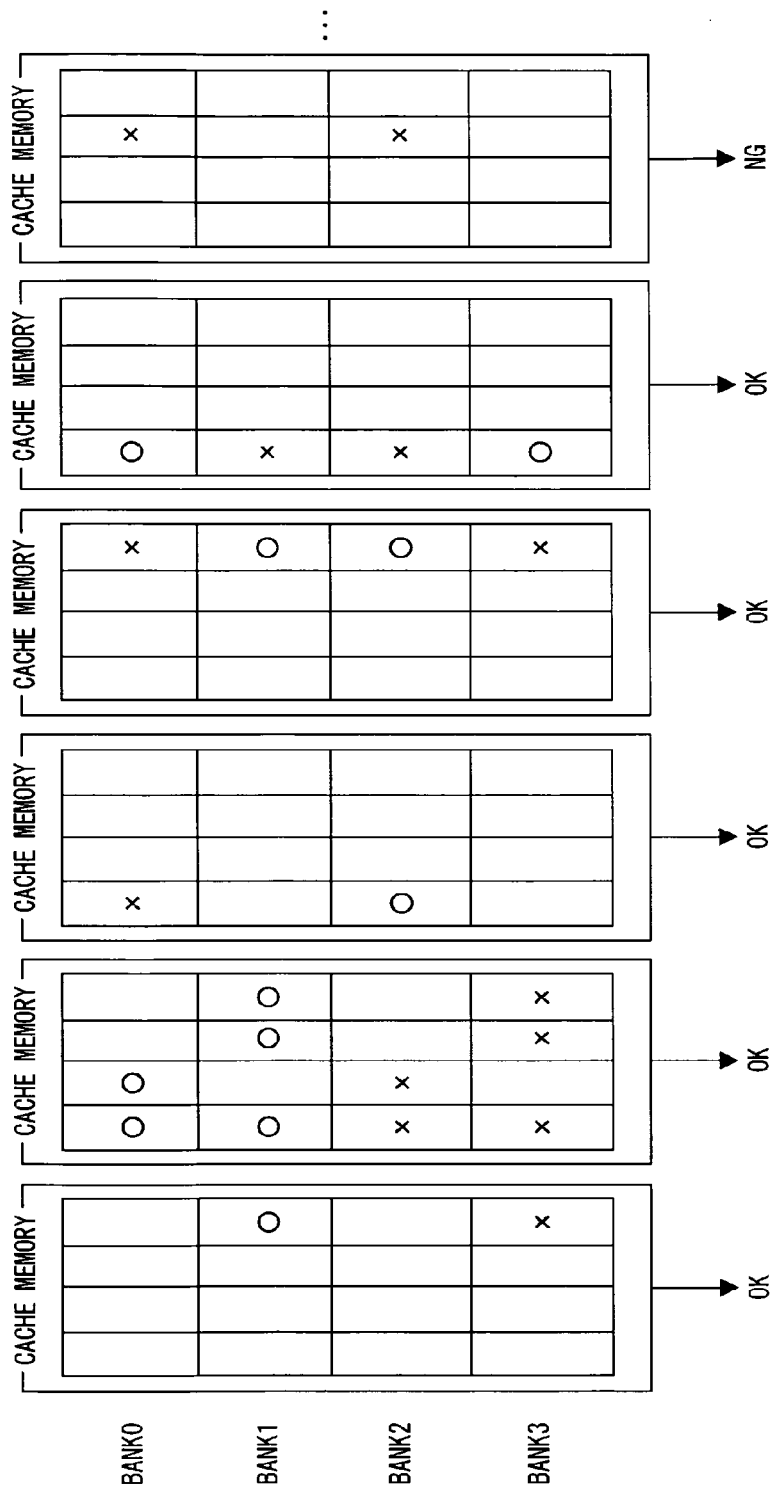
FIG. 5 shows a description of an example operation of a cache memory built into a processor according to an embodiment of the present invention.
Figure 8:
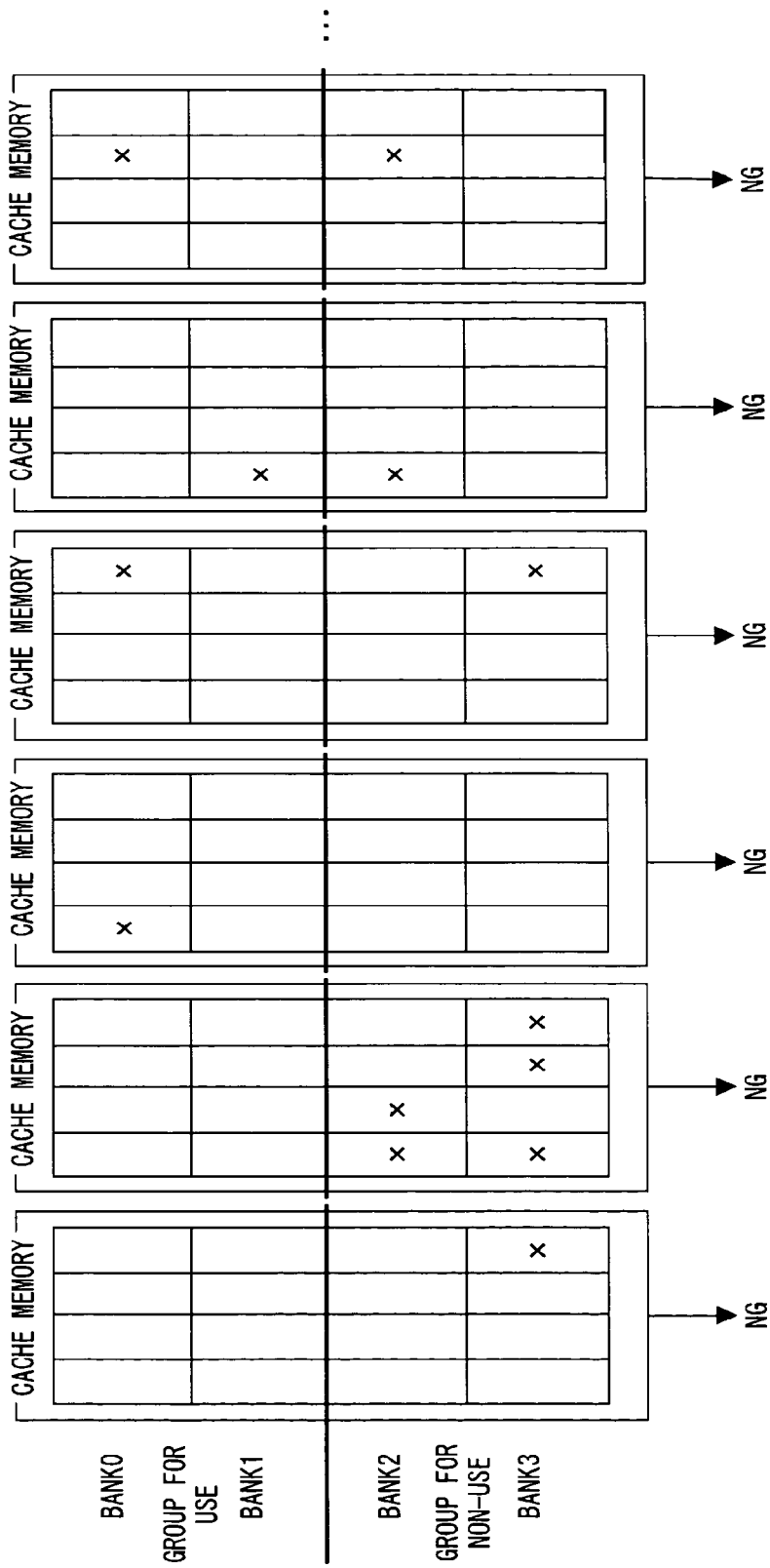
FIG. 8 illustrates a substitution method at an operation failure of a cache memory according to a prior art related to the present invention.

A preferred embodiment of the present invention is described below, referring to the relevant drawings. FIG. 1 illustrates an example of the architecture of a cache memory as a component of a processor according to an embodiment of the present invention; FIG. 2 illustrates an example of whole architecture of a processor according to an embodiment of the present invention; FIG. 3 illustrates an example of internal architecture of a cache memory built into a processor according to the present embodiment; FIGS. 4 and 5 show description of an example operation of a cache memory built in a processor according to the present embodiment; FIGS. 6 and 7 shows a flow chart of an example of a production method for a processor and a cache memory according to the present embodiment; and FIG. 8 illustrates a substitution method at an operation failure of a cache memory according to a prior art related to the present invention.

To begin with, for example as shown in FIG. 2, a processor 10 according to the present embodiment includes an instruction unit 20; an execution unit 30 executing under the control of the instruction unit 20; and a storage control unit 40 performing pre-fetch of instructions which are to be given to the execution unit 30, and input and output of data, i.e. operand, which make the operational object of the aforementioned instructions, from a not-shown main storage by way of a below-described second cache control unit 50.

The storage control unit 40 includes an instruction-fetch local buffer 41 for looking ahead instructions, and a instruction buffer tag 42 storing tag information used for reading out the instruction stored in the instruction-fetch local buffer 41.

And the storage control unit 40 includes an operand local buffer 43 for temporarily storing operands inputting and outputting into and out from, respectively, the execution unit 30 and the instruction unit 20, and of an operand buffer tag 44 for storing tag information used at access to the operand local buffer 43.

The processor 10 is further equipped with a second cache control unit 50 which is a hierarchical storage lower than the storage control unit 40.

The second cache control unit 50 includes a second cache data part 53 (cache memory) which consists of memory media such as RAM, a second cache tag part 52 storing tag information used at accessing the second cache data part 53, and a second cache control part 51 controlling access to the second cache data part 53.

In the case of the present embodiment, the second cache data part 53 consists of a plurality (eight (8) in this case) of cache slots 53a (WORD 0 (SL 0) through WORD 7 (SL 7), and each of the cache slots 53a consists of a plurality (sixteen (16) in this case) of RAMs (Random Access Memories) (memory blocks) 53b.

And each of the cache slots 53a is equipped with a RAM screening control circuit 54 (screening control function) as an example shown in FIG. 1, and the aforementioned cache slot 53a is accessed by the second cache control part 51 by way of the RAM screening control circuit 54.

The RAM screening control circuit 54 includes a BANK decoder 55 receiving a request address 51a from the second cache control part 51, a BANK substitution control part 56 performing the later described substitution control corresponding to a presence/absence of a failure occurring in each of RAM 53b, and a read-out selector 57 (selection circuit) for outputting read-out data from the cache slots 53a to the outside of the second cache data part 53.

The BANK substitution control part 56 is also equipped with a fuse 56a (pass/fail information memory unit) memorizing a pass/fail result of the later described test on each RAM 53b in hardware wise which disables a rewriting.

The BANK substitution control part 56 is also connected with a pass/fail RAM register (pass/fail register) 58, being equipped in each of the cache slots 53a and disposed for memorizing the pass/fail information of each of the test results performed on a plurality of RAMs 53b in the aforementioned cache slots 53a in a rewritable and sustainable manner.

And the BANK substitution control part 56 is disposed for controlling substitution of a sound RAM 53b for a failed RAM 53b based on the information stored either in the fuse 56a or the pass/fail RAM registers 58 about the presence/absence of a failure occurring in each of the RAM 53b.

The processor 10 comprising as described above according to the present embodiment consists of a semiconductor integrated circuit apparatus such as a one-chip LSI (Large Scale Integrated Circuit) for example, and is produced by a semiconductor production process as exampled in FIG. 6.

That is, a single crystal semiconductor wafer is prepared (step 201), and each component part as described above is architected for forming a semiconductor integrated circuit in the semiconductor wafer by using the photolithography technology (step 202). Then, each processor 10 is cut out of the semiconductor wafer as an individual chip, followed by performing the functional testing for each part of the processor 10 (step 203). At the point of the functional testing, a series of testing and salvaging operations are done as the later described flow chart as exampled by FIG. 7.

Following the testing, the processors 10 sorted into a pass or a semi-pass are sealed in plastic or ceramic packages (step 204), the functional testing on board the actual data processing system is done (step 205) before shipping out (step 206).

Incidentally, for example, the second cache data part 53 is of 4 mega bytes, consisting of 4 BANKS, 4 WAYS, and assumed to be consisting of 128 pieces of 4-kilobyte RAMs 53b.

That is, the second cache data part 53 consists of a plurality (eight in this case) of the cache slots 53a, with each cache slot 53a being consisting of a plurality (sixteen in this case) of RAM 53b, a total of 128 (8 multiplied by 16) of RAMs 53b, as exampled by FIG. 3.

And in each cache slot 53a, each individual RAM 53b belongs to either one in the combination of four WAYS (WAY 0 through WAY 3) by four BANKS (BANK 0 through BANK 3). In case either one of RAMs 53b is found to be faulty, a sound RAM 53b in a different BANK within the same WAY will be substituted for.

Note that the BANK numbers 0 through 3 use two bits, the $18^{th}$ and $19^{th}$, within an optional bit wide address (request address 51a) accessing the second cache data part 53 as exampled by FIG. 4, thus noted by ADRS<19:18>.

In the related prior art, when the capacity of the second cache data part 53 was in a two-megabyte mode, a half of four-megabyte mode, the RAM group was simply divided into two groups, and RAMs in one group were put to no-use, resulting in using only BANK 0 and BANK 1 in each Word (cache slot 53a) as exampled by FIG. 8.

In that case, if a failure was found in one RAM corresponding either to BANK 0 or BANK 1, the chip (processor 10) was classified as a failure to ship, thus ending up being discarded, even though there was no failure in RAM corresponding to BANK 2 or BANK 3.

Comparatively, according to the present embodiment, if a failure occurs in the unit test process as exampled by the flow chart in FIG. 7, a substitution is done between RAMs 53b in each cache slot 53a, thereby making a probability of being salvaged high.

That is, at the completion of chip production for processor 10 in the step 202 as illustrated by FIG. 6 (step 101), the functional testing (self-test) of each RAM 53b is performed by the not shown self test circuit built in RAM 53b (step 102).

Then, a judgment is made as to whether or not this test is performed for the first time (step 103), and if it is the first time, a judgment is made as to whether or not there is a failure in each bit of RAM 53b (BIT-FAIL) and FAIL information is collected if there is such a failure (step 105), the fuse is cut for salvaging from error by substituting in the bit level provided in each of RAMs 53b (step 106), and the test in the step 102 is done again.

In the above, if no failure is found in the step 104 after the first test, the processor 10 is shipped out as a perfect pass (with the capacity of the second cache data part 53 being four megabytes) (step 112).

If a failure in RAM 53b is found in the first test and the judgment in the step 103 is that the second test has been done, and if an examination of the second test result does not uncover any failure, then a decision is made that the bit basis salvage in RAM 53b has been successful (step 107), and the aforementioned processor 10 is shipped out as a perfect pass (step 112).

On the other hand, if judged to have failed in the step 107, a presence/absence of a failure is detected in each RAM 53b basis and the result thereof is recorded in the fuse 56a furnished in the BANK substitution control part 56 and in the pass/fail RAM registers 58 (step 108).

Then, in the BANK substitution control part 56, a substitution between a failed and a sound RAM 53b is tried based on the pass/fail information memorized in the fuse 56a (step 109), and if it is possible for substituting (step 110), the processor 10 will be shipped out as a semi-pass (having the capacity of the second cache data part 53 being two (2) megabytes, a half of four (4) megabytes) (step 112).

If substitution is judged to be impossible in the step 110, the aforementioned processor 10 will be discarded (step 111).

As described above, in the present embodiment, because the BANK substitution control part 56 is disposed for substituting between RAMs 53b within the cache slot 53a for the chip of a processor 10 failing in the second self test by the built-in self test circuit in the unit test for the processor 10 (step 107) by the fuse 56a memorizing the pass/fail information of RAM 53 band based upon data in the fuse 56a, enabling substitution of a sound RAM 53b for a failed RAM 53b, it is possible to produce processors 10 in the semi-pass grade with a better yield even if a failure occurs in RAM 53b in the second cache data part 53.

That is, in the present embodiment, the fuse 56a equipped in the BANK substitution control part 56, for example, corresponds to each of 128 pieces of 4-kilobyte RAMs 53b constituting the second cache data 53 having a capacity of 4 megabytes, and is of 128 bits.

Random two sound pieces are selected, because of the logic composition in the second cache data part 53, from the four pieces of RAM 53b within the same WAY (BANK 0 through BANK 3) in each of the cache slots 53a for substituting these 128 pieces of RAMs 53b for one another. In defining substitution pairs of RAMs 53b, a pair of RAMs 53b is defined by addressing corresponding bits between BANK 0 and BANK 2, and BANK 1 and BANK 3, as shown in FIG. 4, established by the 18$^{th}$ bit ADRS of the absolute address for accessing the second cache data part 53. That is, ADRS<19> is not used in this case. Note that each RAM 53b constituting the second cache data part 53 is called as follows. For example, RAM at WAY 0, BANK 0 in Word 0 (SL 0) is called SL 0/00, while RAM at WAY 3, BANK 3 in WORD 7 (SL 7) is called SL 7/33.

For a failed RAM 53b, the value of the fuse 56a is set at "0." Referring to a combination of two-bit values in the fuse 56a of a substitution pair, a RAM 53b in the substitution pair is substituted in the BANK substitution control part 56. For example, since SL 0/00 and SL 0/02 are a substitution pair, if a value of the fuse 56a for SL 0/00 is "0" and a value of the fuse 56a for SL 0/02 is "1," then SL 0/02 is substituted for SL 0/00.

That is, as exampled in FIG. 5, a sound RAM 53b located in the position marked by ○ is substituted for a failed RAM 53b located in the position marked by x.

As described so far, for the processor 10 having failed (NG) in the second self test after substituting by the redundant bit in RAM cell for a failed bit as a result of a self test, the pass/fail RAM information is automatically taken into the fuse 56a in hardware wise, and a substitution processing is performed in the BANK substitution control part 56, thereby enabling the substitution setting for RAM 53b in the second cache data part 53 of the processor 10 at shipping, without externally managing or setting the pass/fail RAM information resulting from the unit test for each processor 10.

By this, a processor 10 failing at the level of RAM 53b in the second cache data part 53 is effectively salvaged as a semi-pass processor 10, thereby substantially increasing the yield in the production process for processor 10 and saving time for sorting them.

An example of a substitution operation by using the pass/fail RAM register 58 is then described as follows. As described before, the pass/fail RAM register 58 consists of rewritable registers, and is used as a complementary function for the substitution operation between a failed and sound RAM 53b.

That is, if a testing of processor 10 in a frequency sorting test process or in a data processing apparatus after the testing in the step 205 as shown in the flow chart of FIG. 6, or after being shipped out from the semiconductor plant (step 206), discovers that the substitution operation in the previous unit testing (FIG. 7) or the test result was insufficient, then the data in the pass/fail RAM register 58 will be corrected by rewriting. And based on the setting of the pass/fail RAM register 58, the BANK substitution control part 56 makes a sound RAM 53b substitute for a failed RAM 53b, thereby enabling dynamically setting for a targeted, semi-pass processor 10.

As described above, according to the present embodiment, the functional test result of RAM 53b constituting the second cache data part 53 of the processor 10 is memorized in the fuse 56a furnished in the BANK substitution control part 56 in hardware wise, and a sound RAM 53b is flexibly substituted for a failed RAM 53b, thereby improving dramatically the yield as the semi-pass processors 10 in the production process of the processor 10. Hence the processor 10 becoming available in the production process thereof according to the present embodiment will come in three kinds, i.e., (1) perfect pass (a perfect pass in the memory capacity of the second cache data part 53; (2) semi-pass (a memory capacity of the second cache data part 53 being smaller; and (3) fail.

As described above, the present embodiment provides a substantial improvement in the production yield as compared to a conventional method in which the RAMs constituting the second cache data part 53 were divided into groups followed by a substitution operation done in each group basis, and therefore a failure of a specific RAM 53b in the second cache data part 53 caused the whole processor 10 to be discarded as a fail.

Also, by furnishing with the rewritable pass/fail RAM register 58 in addition to the fuse 56a, it becomes possible to correct dynamically the setting for substituting a sound RAM 53b for a failed RAM 53b by the fuse 56a, even if a failure is discovered in a later process, thereby improving substantially the yield and the reliability of the processors 10.

It goes without saying that the present invention is not limited to the examples put forth in the embodiment as described above but is changeable in various ways within the scope of the invention.

According to the present invention, the advantage gained is that the production yield of the processors each having a built-in cache memory is improved.

According to the present invention, the advantage gained is that the production yield of the cache memories of a redundant configuration built in processors is improved.

According to the present invention, the advantage gained is that it is possible to produce a variety of processors having different memory capacities effectively by taking advantage of a reduction in the memory capacity for salvaging a faulty cache memory.

We claim:

1. A processor, comprising an execution unit; an instruction unit controlling said execution unit; a storage control unit controlling an input and output for said execution unit and instruction unit; and a cache memory temporarily storing information exchanged between said execution and instruction units, and an external memory apparatus, wherein said cache memory comprises:

a first area and a second area each having a plurality of independent memory blocks;

a pass/fail information memory unit to memorize, for each of the memory blocks, information indicating a presence or an absence of a failure having occurred in each of said memory blocks; and a screening control unit to substitute a failed memory block within either one of the first area or the second area with a sound memory block within the other one of the first area or the second area based on a content of said pass/fail information memory unit, the substitution causes the sound memory block to function in place of the failed memory block wherein the screening control unit substitutes the failed memory block within the second area with the sound memory block based on the content of said pass/fail information memory unit; and the plurality of independent memory blocks included in the second area other than the failed memory block and the sound memory block in the first area are usable memory blocks of the cache memory.

2. The processor according to claim 1, wherein said pass/fail information memory unit includes a fuse for memorizing the presence or absence of a failure having occurred in each of said memory blocks in a fixed manner.

3. The processor according to claim 1, wherein said pass/fail information memory unit includes a pass/fail register for memorizing the presence or absence of a failure having occurred in each of said memory blocks in a rewritable manner, and said screening control unit substitutes said failed memory block with said sound memory block corresponding to a setting condition of said pass/fail register.

4. The processor according to claim 1, wherein a capacity of said memory block is one half of the total memory capacity of said cache memory or less.

* * * * *